United States Patent [19]

Roos et al.

[11] Patent Number: 4,800,464
[45] Date of Patent: Jan. 24, 1989

[54] MODULAR SHIELDING ASSEMBLY FOR ELECTRONIC DEVICES

[75] Inventors: Mark D. Roos, San Carlos; Walter J. Messmer, III, San Jose, both of Calif.

[73] Assignee: EIP Microwave, Inc., San Jose, Calif.

[21] Appl. No.: 152,611

[22] Filed: Feb. 5, 1988

[51] Int. Cl.[4] ............................................. H05K 9/00
[52] U.S. Cl. ................................. 361/424; 174/35 R
[58] Field of Search ............. 174/35 R, 35 MS, 35 C, 174/35 TS; 361/424, 429, 394

[56] References Cited

U.S. PATENT DOCUMENTS

| | | | |
|---|---|---|---|
| 3,816,911 | 6/1974 | Knappenberger | 361/424 |
| 4,322,572 | 3/1982 | Snyder | 174/35 R |
| 4,370,515 | 1/1983 | Donaldson | 361/424 |

Primary Examiner—Roy N. Envall, Jr.
Attorney, Agent, or Firm—Nilsson, Robbins, Dalgarn, Berliner, Carson & Wurst

[57] ABSTRACT

A modular electronic shielding assembly having a housing in which a ground plane platform is held. The housing is formed from a conductive material which provides for electromagnetic isolation. The ground plane platform also provides for electromagnetic isolation by having disposed on one side thereof a conductive layer. This ground plane platform separates the housing into two electromagnetically isolated compartments. The ground plane platform has electronic circuitry formed upon that surface opposite the conductive layer, which circuitry is isolated from the microwave components by one of two techniques. The first involves mounting the components to the opposite surface of the platform which carries the conductive layer, or by forming the components on one side of a daughterboard with the opposite side bearing a conductive layer. The daughterboard is mounted on that platform surface bearing the circuitry with the daughterboard conductive surface facing the circuitry. The assembly further includes varies electrically conductive framing members which are selectively assembled to construct a desired enclosure about one or more high energy electronic components affixed to one side of the platform. The invention is further directed at particular preconstructed electrically conductive framing members that are selectively positioned together to construct a desired electgromagnetically isolating enclosure about one or more components, particularly a microwave component.

16 Claims, 3 Drawing Sheets

MODULAR SHIELDING ASSEMBLY FOR ELECTRONIC DEVICES

BACKGROUND OF THE INVENTION

The present invention relates to electronic systems, more specifically to devices for shielding the various components of such electronic systems from electromagnetic energy.

Electronic systems are constructed from various types of components, e.g., amplifiers, splitters, comparators, attenuators and the like. In many applications, some of these components must be shielded from electromagnetic energy to protect the components from becoming inoperative. One such application is where microwave energy is delivered to the system and used or acted upon by the individual components. These systems must be constructed to electromagnetically shield the individual components. This is particularly important for those components which are particularly sensitive to the effects of microwave energy, e.g., printed circuits. These types of components must be isolated from extraneous electromagnetic radiation which would affect their operation. Furthermore, the components must be shielded to reduce the potential of electromagnetic energy emission to the external environment.

Presently, electromagnetic shielding is performed by independently placing each component in a housing formed from an electrically conductive material, e.g., aluminum. The individually housed components are then assembled and supported in some manner to construct the overall device. Any necessary interconnections between the numerous components are made using appropriate cables and wave guides. The device is then further electromagnetically isolated by being placed in an housing formed from an electrically conductive material.

While this type of construction achieves the desired result, that is, electromagnetic isolation of the numerous device components, the resulting structure is large and expensive to build.

Furthermore, it is desirable to provide separate electromagnetic isolation for the individual subunits, e.g., daughterboards, of the components making up the device, specifically subunits of printed circuits which are particularly vulnerable to microwave energy. However, presently available construction techniques make the separate electromagnetic isolation of these individual subunits impractical.

It would thus be beneficial to provide a mechanism by which the numerous components of an electronic device are more easily electromagnetically isolated as a package prior to assembling the complete device and further to provide a mechanism for individually isolating the separate subunits of the electronic components.

SUMMARY OF THE INVENTION

The invention is directed to a modular electronic shielding assembly. This assembly includes a housing in which a ground plane platform is affixed to define two separate compartments. This ground plane platform has disposed along one surface a layer of conductive material to electromagnetically isolate the compartments from one another. One or more microwave components are affixed to this surface. An opposite surface of the ground plane platform includes electronic circuitry, which circuitry is electrically coupled to each of the microwave components by through hole connections. As would be apparent to one skilled in the art such through hole connections are made to electrically isolate such connections from the conductive layer 13.

A plurality of framing members, which are constructed from electrically conductive materials, are selectively assembled about each microwave component to construct an electromagnetic shielding enclosure. The construction of the housing to electromagnetically isolate the two compartments from one another, in addition to the framing members disposed about each microwave component, provides electromagnetic isolation of each microwave component thereby isolating the electronic circuitry from the microwave energy delivered to or received from each microwave component.

The invention is further directed at particular electrically conductive framing members which are preconstructed to allow a user to selectively position various members together about a microwave component to construct a electromagnetic shielding enclosure.

In accordance with another embodiment of the invention individual daughterboards carrying the microwave components are mounted to that side of the platform carrying the electronic circuitry. The underside of the daughterboard carries a conductive layer which functions to electromagnetically isolate the microwave component from the electronic circuitry in combination with an enclosure formed from the framing members.

BRIEF DESCRIPTION OF THE DRAWINGS

The present invention may be better understood, and its advantages will be apparent to those skilled in the art by reference to the accompanying drawings, wherein like reference numerals refer to like elements in the several Figures, and wherein.

DESCRIPTION OF THE INVENTION

The invention is directed to a modular assembly for electromagnetically isolating the various components and portions of such components of an electronic device. Electronic devices are typically constructed from various components to which the electronic energy is delivered. It is sometimes necessary to individually electromagnetically isolate each component in order to assure the proper functioning of the separate components.

The invention is directed to an assembly which includes selectively arranging various modular elements to construct an appropriate electromagnetic shielding housing for a particular electronic module, and in particular a microwave operating module which includes both electronic circuitry and microwave components. Specifically, the invention is an assembly for housing a microwave module in which the electronic circuitry is electromagnetically isolated from the microwave components, and in which the individual microwave components are electromagnetically isolated from each other.

Furthermore, the invention is directed to specific framing members which are formed to be selectively fitted about each microwave component mounted to a ground plane platform which is fitted in the assembly housing. These framing members electromagnetically isolate the microwave components from one another. These specific framing members are preferentially selectively arranged and interlocked about a desired microwave component for electromagnetically isolating that particular component.

Figure 1:
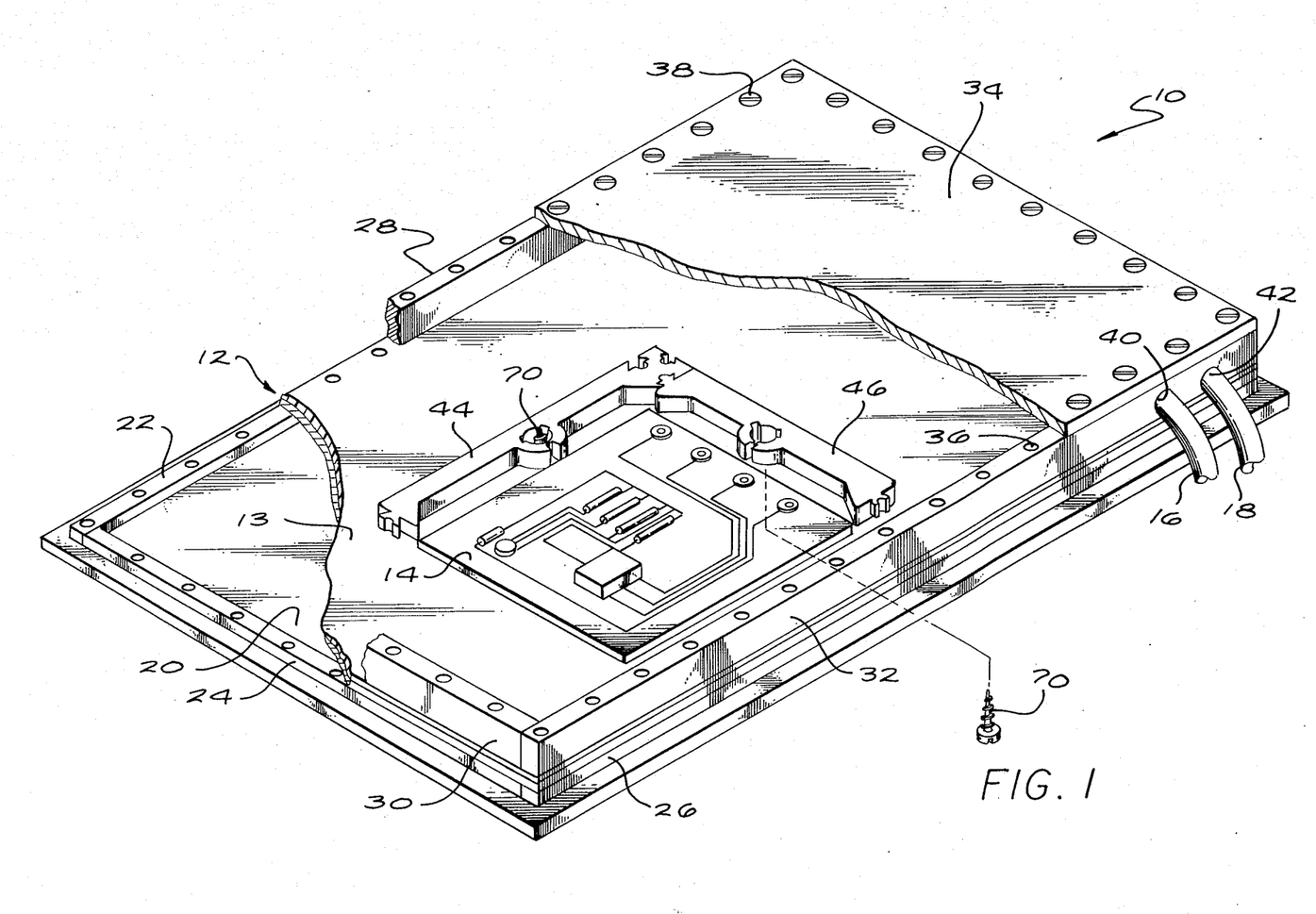
FIG. 1 is a partially broken-away view of a modular assembly of the invention in which a microwave component is shown mounted to that surface of the ground plane platform to which the layer of conductive material is disposed.

Referring now to FIG. 1, a partially broken-away view of a modular housing assembly in accordance with the invention is seen generally at 10. This housing assembly 10 houses a ground plane platform 12, which subdivides the housing into two separate compartments. This ground plane platform 12 has formed along one side, not shown, printed circuit traces to which are connected electronic components defining in combination an electronic device. The specific device is not critical to the invention.

The opposing surface of the ground plane platform 12 has disposed thereon a conductive layer 13. This conductive layer 13 may be disposed on this surface by any one of known techniques, i.e. sputtering or vapor deposition techniques. The precise technique and composition of the conductive layer 13 is not critical to the invention.

When secured in the housing assembly 10 this conductive layer 13 on the ground plane platform 12 electromagnetically isolates each compartment from one another. This is critical since one or more microwave components will be affixed to the ground plane platform 12 upon the conductive layer 13 side to construct in combination with the electronic device formed on the opposing surface of the platform 12 a specific microwave electronic module.

These microwave components are of the type which radiate high levels of energy which would electromagnetically interfere with the electronic circuitry. In describing the preferred embodiment of the invention reference is being made to microwave modules which include both electronic circuitry and microwave components, however, the invention is not limited to only microwave modules or components, but to any type of module including one or more components which would electromagnetically interfere with the electronic circuitry.

In particular, the present invention is useful for a microwave network analysis device which is constructed from numerous microwave modules. The various electronic circuitry of each module as well as the microwave components need to be electromagnetically shielded from each other in order to minimize electromagnetic interference.

For purposes of this description the ground plane platform 12 is being illustrated with only one microwave component 14 mounted thereon. Additional microwave components may be mounted to ground plane platform 12 as will be necessary to construct a specific microwave module. As will be described more fully herein each microwave component affixed to the platform 12 is electromagnetically isolated from any other microwave components mounted to the ground plane platform 12.

Electronic signals and microwave energy are delivered to and from the electronic circuitry and microwave component 14 through a pair of electronic conduits, illustrated as coaxial cables 16 and 18. Each of the two cables 16 and 18 is selectively connected to a port of a cable connector, not shown, which is mounted in a side of the housing assembly 10. These cable connectors are of the feed through type to which the cables 16 and 18 are connected to deliver or receive electronic signals or microwave energy. Connectors useful for this purpose are not critical to the invention and will not be described in any detail herein. The electronic circuitry, again not shown, as well as the microwave component 14 are connected to the selected port of the cable connector, not shown, by known techniques which are not critical to the invention. Each of these cables 16 and 18, as well as the suitable connectors, are themselves electromagnetically shielded to reduce the danger of electromagnetic interference impairing the functioning of the individual electronic circuitry and microwave components.

A specific device (not illustrated) is constructed from one or more modules contained in separate housing assemblies 10, which are assembled together. In assembling the device, each of the individual modules, as well as the electronic circuitry and microwave components of each modules will have to be electromagnetically isolated from each other.

In accordance with the invention the electronic circuitry and each of the individual microwave components are electromagnetically isolated by selectively assembling the housing assembly 10 about the ground plane platform 12 from electrically conductive elements. These elements electromagnetically isolate the electronic circuitry and each microwave component.

With reference to FIG. 1, the various types of elements of the electromagnetically isolating modular housing assembly 10 of the invention will be described. The modular housing assembly 10 includes a first end plate 20 to which the ground plane platform 12 is mounted. This end plate 20, as well as the other elements forming the housing assembly 10 are formed from an electrically conductive material, e.g., a conductive metal or a metal loaded plastic, to provide for the electromagnetic shielding.

The ground plane platform 12 is mounted to the end plate 20 by one or more spacer elements, with three such spacer elements seen at 22, 24 and 26, to spatially separate the ground plane platform 12 from end plate 20 and define a first compartment of the housing assembly 10. A fourth spacer element, not shown, is positioned opposite the spacer element 24 between the end plate 20 and the ground plane platform 12. As illustrated, the four spacer elements form a frame-like structure about the lower periphery of the ground plane platform 12.

Four additional spacer elements are secured about the periphery of the opposing side of the ground plane platform 12 to form a second frame-like structure. These four spacer elements, three of which are seen at 28, 30 and 32, enclose the microwave components 14 mounted to the ground plane platform 12.

All of the above described spacer elements are generally elongated rectangular members formed from an electrically conductive material. The length and thickness of the individual spacer elements will vary to allow for the appropriate selection of various spacer elements to form a specifically dimensioned enclosure. One of the individual elements can be made sufficiently thick to support a suitable pass through type connector.

The spacer elements of the invention may enclose not only rectangular components, e.g., the ground plane platform 12, but may enclose a circular or odd shaped component. Further, by forming the individual spacer elements of varying thickness, the overall thickness of the modular housing assembly 10 can be minimized. As illustrated, the spacer elements 28, 30 and 32 are thicker than the spacer elements 22, 24 and 26, while the spacer elements 28, 32, 22 and 26 are longer than the other spacer elements 24 and 30. The particular thickness and length of the individual spacer elements was selected to effectively enclose the ground plane platform 12.

The modular housing assembly 10 is completed by securing a cover or end plate 34 stop the frame-like structure formed by the spacer elements 28, 30 and 32, which define a second housing compartment. The manner by which the entire modular housing assembly 10 is fastened together will depend upon the materials form which the individual elements of the assembly, e.g., the spacer elements, an two end plates 20 and 34, are constructed.

As illustrated, the various elements are constructed from a metallic material such as steel or aluminum, with the various elements fastened together by any suitable means, e.g. numerous threaded screws, one of which is seen at 38. In order to facilitate the fastening of the individual elements together, each such element is formed with one or more threaded apertures, one of which is seen formed in spacer element 32 at 36. The various elements can be positioned to appropriately align the apertures formed in the other elements. A threaded screw is then threaded through each end of the aligned apertures to fasten the elements together. Other suitable fastening means include adhesives. The modular housing assembly 10 may now be erected and mounted together with other microwave modules to construct a microwave device.

The housing assembly 10, as already described, will provide sufficient electromagnetic shielding between the electronic circuitry formed on one side of the platform and the microwave component 14 mounted to the opposite surface of the ground plane platform 12. However, when the module is constructed from one or more of the microwave components 14 mounted to the ground plane platform 12, each component 14 must also be electromagnetically isolated from each other. By further electromagnetically isolating the individual microwave components 14 from each other, the potential of electromagnetic interference to such microwave components by exposure to extraneous microwave energy is reduced.

Each of the microwave components 14 is typically constructed upon a separate substrate to form a daughterboard which is mounted to the ground plane platform 12 by known techniques. In this manner, if the individual microwave component 14 becomes inoperative for any reason it may be replaced instead of replacing the entire ground plane platform 12. Further, each microwave component 14 is electronically coupled to the underlying electronic circuitry by any one of known techniques. For example, the ground plane platform 12 can be formed with through hole connectors, not shown, which allows the individual microwave components 14 to be electrically coupled to the electronic circuitry.

In order to provide the separate electromagnetic isolation of the individual microwave components 14, the modular housing assembly 10 further includes preformed framing members, two of which are indicated at 44 and 46. As will be described in greater detail herein, each of these framing members 44 and 46 are formed to be selectively secured to the individual ground plane platform 12 to provide a compartment into which a microwave component may be positioned.

While the individual framing members 44 and 46 may be generally rectangular members which are secured together in constructing a compartment, preferably the individual members are formed to be substantially interlocked. The framing members 44 and 46 are each formed with at least a first joint, which will be described further herein, that is compatibly mateable with at least a first joint formed on the other member. These mateable joints allow the framing members 44 and 46 to be selectively joined to each other to form any desired configuration on the ground plane platform 12.

As with the spacer elements the framing members 44 and 46 are formed from an electromagnetically conductive material. Further, these framing members 44 and 46 may be of any length or thickness, provided that such members 44 and 46 can be positioned in the housing assembly 10 as illustrated.

Figure 2:
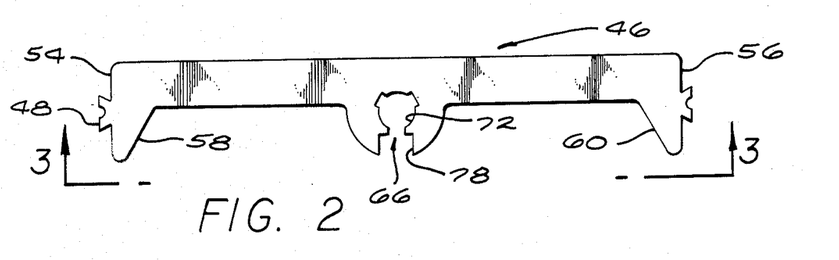
FIG. 2 is top view of a particular type of modular interlocking shielding element in accordance with an embodiment of the invention.
Figure 3:
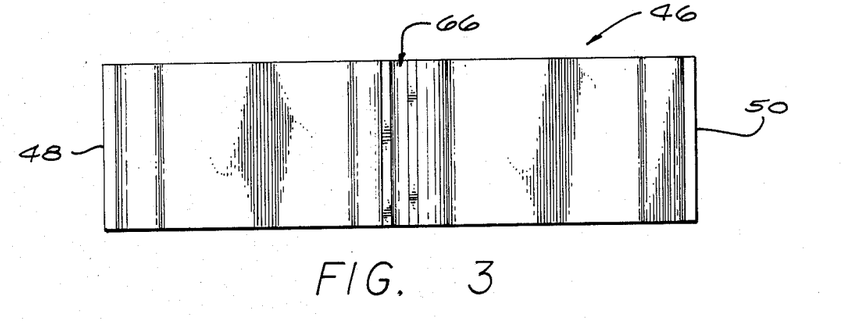
FIG. 3 is a front view of the element of FIG. 2.
Figure 4:
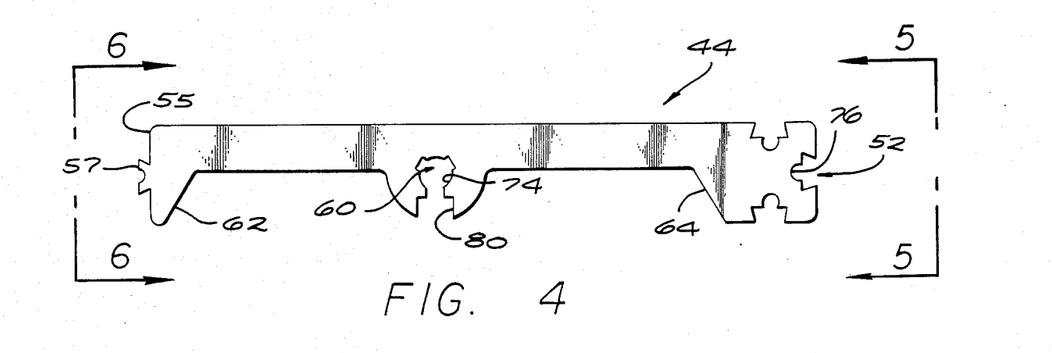
FIG. 4 is a top view of another type of modular interlocking shielding element of the invention.
Figure 5:
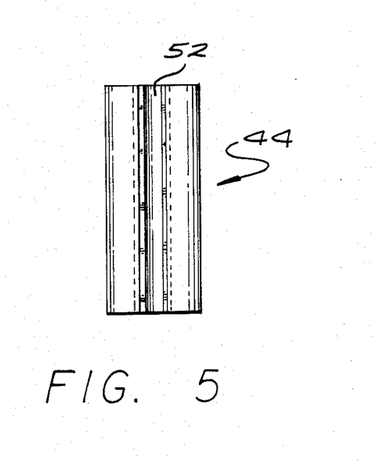
FIG. 5 is a side view of the element of FIG. 4 along line 5—5.
Figure 6:
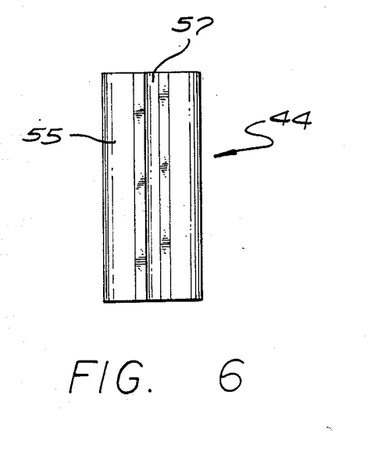
FIG. 6 is a side view of the element of FIG. 4 along line 6—6.

Referring now to FIGS. 2-6, the various framing members will be described. The framing member illustrated in FIGS. 2 and 3 is the member 46 shown in FIG. 1, while the framing member illustrated in FIGS. 4-6 is the member 44 shown in FIG. 1.

As illustrated, both of the framing members 44 and 46 are generally elongated rectangular members formed with bulbous opposing ends. That is, the framing member 46 is formed with opposing bulbous ends 58 and 60, which bulbous ends are substantially triangular in shape, while the framing member 44 is formed with opposing bulbous ends 62 and 64, with end 62 being substantially triangular in shape and with end 64 being shaped more like a square.

The framing member 46 has formed along each of the opposing surfaces 54 and 56 of the ends 58 and 60 a longitudinal key, seen at 48 and 50, respectively, while the framing member 44 has formed along the outermost surface 55 of the end 62 a longitudinal key 57. The keys 48 and 50 are formed to be slidably received in at least a first compatibly formed keyway, seen in FIG. 4 at 52, formed lengthwise in at least a first surface of the end 64 of the other framing member 46. In this manner the two framing members 44 and 46 can be joined together, as best seen in FIG. 1. The key 57 of the framing member 44 may be received in a respective keyway 52 of another similarly constructed framing member.

The keys 48, 50 and 57 are each triangularly shaped protrusions which run substantially the entire length of the respective of the laterally outermost surface 54, 56 and 55. The keyway 52 is a compatible shaped triangular notch formed in at least one surface of the framing member 44 end 64. As seen in FIG. 4, this end 64 is formed with three such keyways 52. The keyways 52 further define a semicircular recess, one of which is seen at 76, traversing the entire length of that surface of the triangular shaped notch opposing the notch opening. The purpose of this semicircular recess 70 will be described further herein.

By forming the keys 48, 50 and 57 and the keyway 52 with this type of configuration, the keys 48, 50 or 57 once situated in a respective keyway 52 may not be dislodged by being pulled laterally outward. This manner of constructing the keys and keyways will prevent dislodgement of the framing members 44 and 46 from each other once they are secured to the ground plane platform 12.

Each of the framing members 44 and 46 is also formed with at least a first screw guideway 66 and 68, respectively. These screw guideways 66 and 68 are configured to receive a self-tapping screw, one of which is seen in FIG. 1 at 70. The self-tapping screw 70 will tap into the guideway as it passes therethrough. The self-tapping screw 70 is screwed through the ground plane platform 12 or cover 34 and into the guideway to secure in place the respective framing member. The ground plane platform 12 or cover 34 may, if desired, be provided with apertures through which the self-tapping screw can be passed into the guideway.

The screw guideways 66 and 68 are defined in a substantially semicircular member which depends outward from the framing member 44 or 46. Passageways 72 and 74 are formed through the length of each of the respective semicircular members defining the guideways 66 and 68. The individual screws 70 will be thread into these passageways 72 and 74 for securing the framing member 44 or 46 in place to either the ground plane platform 12 or cover 34.

By positioning the screw guideways 66 and 68 to lie adjacent the microwave component 14, the body of each framing member 44 and 46 is separated from the edge of the respective microwave component 14. This spatial separation provides room to allow a tool to be inserted under the microwave component 14 to lift it off the ground plane platform 12, or to allow for a particular component on the microwave component 14 to be removed.

Once the individual framing members 44 and 46 have been interlocked by the appropriate mating of the respective keys and keyways, and secured to the underlying ground plane platform 12 or cover 34, a conductive epoxy or similar adhesive may be injected into the semicircular recesses 76 of each keyway 52 in which a key is positioned. The epoxy will enhance the bonding of the various framing members together and enhance the effectiveness of the electromagnetic shielding function of the assembled framing members 44 and 46. However, it is not necessary to inject the epoxy in order to achieve the desired effects of the framing members of the invention.

The guideway 66 and 68 may also be formed with an outward facing rectangularly or triangularly shaped recess, seen at 78 and 80 respectively, for receiving a key 48, 50 or 57 of another framing member 44 or 46. This will allow the various framing members 44 and 46 to be assembled in different arrangements.

The framing members 44 and 46 may also be constructed with the keys and keyways formed at locations other than those illustrated and described. The members 44 and 46 may include keys and keyways at various locations along their lengths, as well on either or both sides. This allows the various members to be assembled in numerous arrangements. Further, by the appropriate placement of the various members a space may be formed between the edge of the ground plane platform, or any underlying structure, and the wall of the member. This would allow entry into the confines of the assembled members for removal of or repair upon the component or microwave components lying therein.

The framing members 44 and 46 may also be constructed with other interlocking mechanisms. For example, a tongue and groove configuration may be substituted for the above described and illustrated key and keyways. Furthermore, the various framing members may be simply positioned side-by-side and secured in place without any interlocking mechanism. These framing members are utilized to construct where needed an appropriate electromagnetically isolated region.

Figure 7:
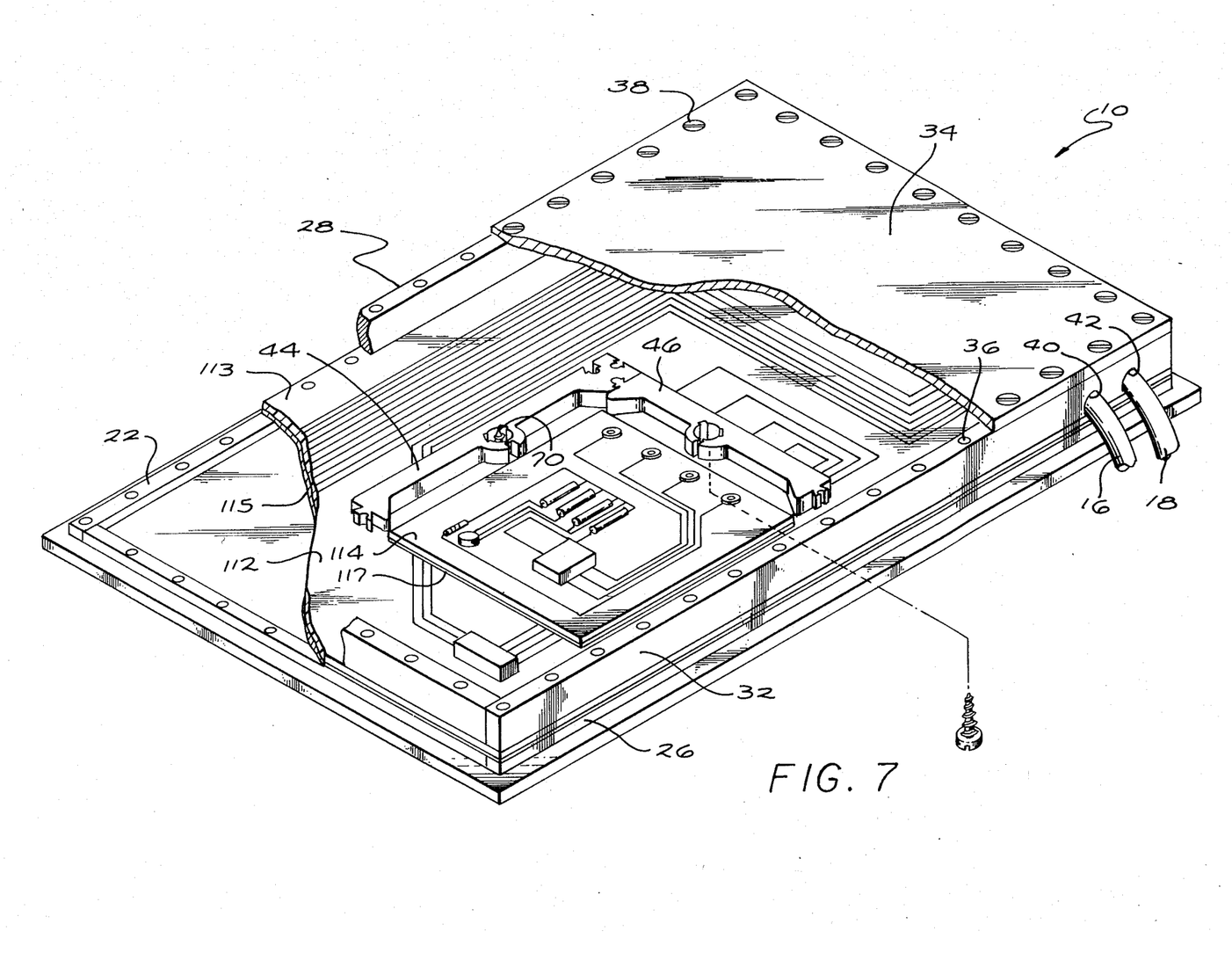
FIG. 7 is a partially broken-away view of an embodiment of a modular assembly of the invention in which a microwave component is shown mounted to that surface of the ground plane platform upon which the electronic circuitry is formed.

Referring now to FIG. 7 another embodiment of the invention is seen generally at 110. In describing this embodiment those elements which are the same as the embodiment described with reference to FIG. 1 are numbered with the same reference numerals and will not be described again. The difference between the embodiment of FIG. 7 and the embodiment of FIG. 1 concerns a different construction of those elements which function as the ground plane platform 12 and the individual microwave components 14.

In particular, the ground plane platform 112 of this embodiment is formed with the electronic circuitry, as illustrated by the various traces 113, disposed on that side to which the microwave component 114 is mounted. The platform 112 need not include a layer of conductive material disposed on the opposite side as did the ground plane platform 12 of the embodiment illustrated in FIG. 1, however, such a layer is seen generally at 115.

The embodiment seen in FIG. 7 still provides for the electromagnetic shielding of the electronic circuitry from the microwave energy emitting from the component 114. This shielding is provided by disposing a layer, in accordance with known techniques, of a conductive material to the underside of the component 114, with such layer being seen generally at 117. As would be apparent to one skilled in the art such conductive layer 117 would be electrically insulated from the electronic circuitry 113 when the daughterboard or component 114 is mounted to the platform 112.

That is, the component 114, or daughterboard, is typically formed on a board much like a standard circuit board with the necessary microwave components being secured thereto. The conductive layer 117 is formed on the underside of the daughterboard to form one portion of the electromagnetic shielding for the microwave component 114. The remainder of the necessary shielding for this component 114 is provided by the various framing members 44 and 46 and the cover or end plate 34 as described above for the embodiment illustrated in FIG. 1.

While the preferred embodiment has been described and illustrated, various substitutions and modifications may be made thereto without departing from the scope of the invention. Accordingly, it is to be understood that the present invention has been described by way of illustration and not limitation.

What is claimed is:

1. A compartmentalized electromagnetic shielding assembly for electronic and microwave components comprising:

a housing formed from an electromagnetic shielding material;

a ground plane platform formed with two opposing surfaces which is dimensioned to be received and retained in said housing to subdivide said housing into two separate compartments, a first of said surfaces having disposed thereon a layer of conductive material to define a ground plane electromagnetically isolating said two compartments, said first surface of said ground plane having mounted thereon at least a first microwave component thereon, a second of said surfaces being formed with electronic circuitry disposed thereon, with said microwave component being electronically connected to said electronic circuitry of said first surface by through hole connectors;

framing members formed from a conductive material which are interlinkable and positionable about each of said microwave components mounted on said first surface of said ground plane platform, said members being dimensioned to fit snugly between said ground plane platform and said housing, whereby said frame members surround said microwave component to establish an electromagnetic shielding of said microwave component.

2. The assembly of claim 1 wherein said housing is comprised of two opposing end walls connected by four peripheral side walls, with each of said walls comprising a conductive material.

3. The assembly of claim 2 wherein each of said peripheral side walls is subdivided into two sections, with said ground plane platform being fit between each of said side wall sections, with said side wall sections between secured together with said platform positioned therebetween.

4. The assembly of claim 3 further including a first cable means connected to said microwave components for delivering microwave energy to or receiving microwave energy from said microwave components, said first cable means passing through said peripheral side walls into housing compartment in which said microwave components are disposed on said ground plane platform first surface, said cable means being enshrouded in a conductive material to form an electromagnetic shielding about said cable means.

5. The assembly of claim 4 further including a second cable means connected to said electronic circuitry for delivering electronic energy to or receiving electronic energy from said electric circuitry, said second cable means passing through said peripheral side walls into housing compartment in which said electric circuitry is formed on said ground plane platform first surface, said second cable means being enshrouded in a conductive material to form an electromagnetic shielding about said second cable means.

6. The assembly of claim 5 wherein said framing members are elongated bars formed at opposing ends with keys and keyways which keys are slidably receivable in said keyways.

7. The assembly of claim 6 wherein each of said framing members are selectively releasably securable to said ground plane platform.

8. The assembly of claim 7 wherein selected ones of said framing means are further formed with at least a first keyway between said opposing ends which can slidably receive a key of another of said framing members.

9. The assembly of claim 8 wherein said keyway formed between said framing member opposing ends is further formed with a passageway through which a screw can be threaded for securing said framing member to said ground plane platform.

10. A compartmentalized electromagnetic shielding assembly for electronic and microwave components comprising:

a housing defined by two opposing end plates connected by four peripheral side walls, each of said side walls being defined by two separate sections, said two opposing end plates and said side wall sections being comprised of an electromagnetic shielding material;

a ground plane platform formed with two opposing surfaces which is dimensioned to be fitted an releasably secured between said sections defining each of said side walls of said housing to subdivide said housing into two separate compartments, a first of said surfaces having disposed thereon a layer of conductive material to define a ground plane electromagnetically isolating said two compartments from each other, a second of said surfaces being formed with electronic circuitry disposed thereon;

one or more microwave components being secured to said ground plane platform first surfaces;

electronic coupling means formed through said ground plane platform to allow electronic coupling of each of said microwave components to said electronic circuitry, said coupling means formed to maintain the electromagnetic isolation between said two housing compartments;

a plurality of interlinkable framing members formed from a conductive material which are selectively assembled about each of said microwave components affixed to said first surface of said ground plane platform, said members being affixed to said first surface and dimensioned to abut up against the adjacent end wall of said housing, whereby said frame members surround and electromagnetically isolated each of said microwave components affixed to said first surface; and first and second cable connecting means mounted in selected ones of said housing walls, said first cable connecting means being coupled to said electronic circuitry to deliver or receive electronic signals therefrom, with said second cable connecting means being coupled to said microwave components to deliver microwave energy to or receive microwave energy therefrom, each of said first and second cable connecting means being formed with an exteriorly disposed coupling joint to which an electronic or microwave cable can be attached.

11. A compartmentalized electromagnetic shielding assembly for electronic and microwave components comprising:

a housing formed from an electromagnetic shielding material;

a ground plane platform formed with two opposing surfaces which is dimensioned to be received and retained in said housing to subdivide said housing into two separate compartments, a first of said surfaces having formed thereon electronic circuitry;

one or more microwave components being individually formed on a substrate having two opposing surfaces, with a first of said substrate surfaces having disposed thereon a conductive material and a second opposite of said substrate surfaces having affixed thereto said microwave component, said substrate being mounted to that surface of said ground plane platform upon which said electronic circuitry is formed with that surface of said substrate upon which said conductive material is disposed being positioned adjacent to said electronic circuitry, said microwave component being electronically connected to said electronic circuitry of said ground plane platform first surface by through hole connectors formed in said substrate;

framing members formed from a conductive material which are interlinkable and positionable about each of said microwave components substrates mounted on said first surface of said ground plane platform, said members being dimensioned to fit snugly between said ground plane platform and said housing, whereby said frame members surround said microwave component to establish an electromagnetic shielding of said microwave component.

12. The assembly of claim 11 further including a first cable means connected to said microwave components for delivering microwave energy to or receiving microwave energy from said microwave components, said first cable means passing through said peripheral side walls into housing compartment in which said microwave components are disposed on said ground plane platform first surface, said cable means being enshrouded in a conductive material to form an electromagnetic shielding about said cable means.

13. The assembly of claim 12 further including a second cable means connected to said electronic circuitry for delivering electronic energy to or receiving electronic energy from said electric circuitry, said second cable means passing through said peripheral side walls into housing compartment in which said electric circuitry is formed on said ground plane platform first surface, said second cable means being enshrouded in a conductive material to form an electromagnetic shielding about said second cable means.

14. The assembly of claim 13 wherein said framing members are elongated bars formed at opposing ends with keys and keyways which keys are slidably receivable in said keyways.

15. The assembly of claim 14 wherein each of said framing members are selectively releasably securable to said ground plane platform.

16. The assembly of claim 15 wherein selected ones of said framing means are further formed with at least a first keyway between said opposing ends which can slidably receive a key of another of said framing members.

* * * * *

UNITED STATES PATENT AND TRADEMARK OFFICE
CERTIFICATE OF CORRECTION

PATENT NO. : 4,800,464
DATED : January 24, 1989
INVENTOR(S) : Mark D. Roos and Walter J. Messmer, III It is certified that error appears in the above-identified patent and that said Letters Patent is hereby corrected as shown below:

Col. 5, line 28, delete "form" and substitute therefor --from--.

Signed and Sealed this

Twenty-sixth Day of December, 1989

Attest:

JEFFREY M. SAMUELS

Attesting Officer     Acting Commissioner of Patents and Trademarks